United States Patent
Su et al.

(10) Patent No.: US 12,111,336 B2
(45) Date of Patent: Oct. 8, 2024

(54) MODULAR VERTICAL PROBE CARD

(71) Applicant: CHUNGHWA PRECISION TEST TECH. CO., LTD., Taoyuan (TW)

(72) Inventors: Wei-Jhih Su, Taichung (TW); Chao-Hui Tseng, New Taipei (TW); Hao-Yen Cheng, Taoyuan (TW); Mei-Hui Chen, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 194 days.

(21) Appl. No.: 17/981,238

(22) Filed: Nov. 4, 2022

(65) Prior Publication Data
US 2023/0314481 A1 Oct. 5, 2023

(30) Foreign Application Priority Data
Mar. 31, 2022 (TW) .................................. 111112388

(51) Int. Cl.
*G01R 1/073* (2006.01)
(52) U.S. Cl.
CPC ................................ *G01R 1/07342* (2013.01)
(58) Field of Classification Search
CPC G01R 1/07342; G01R 1/0466; G01R 1/0483; H01R 12/62; H05K 3/326
USPC ........ 324/500, 754.03, 756.05–758.1, 754.1, 324/754.07, 754.24, 755.1, 756.03, 724, 324/437, 445, 446
See application file for complete search history.

(56) References Cited

U.S. PATENT DOCUMENTS

| | | | |
|---|---|---|---|
| 11,226,354 B1* | 1/2022 | Lee | G01R 1/07314 |
| 2009/0261850 A1* | 10/2009 | Kim | G01R 1/07342 324/754.07 |
| 2017/0242057 A1* | 8/2017 | Mori | G01R 1/07357 |
| 2021/0132112 A1* | 5/2021 | Yamazaki | G01R 1/06733 |
| 2022/0170960 A1* | 6/2022 | Hsieh | G01R 1/07357 |

* cited by examiner

*Primary Examiner* — Alexander Satanovsky
*Assistant Examiner* — Trung Q Nguyen
(74) *Attorney, Agent, or Firm* — Li & Cai Intellectual Property (USA) Office

(57) ABSTRACT

A modular vertical probe card having different probes is provided, and includes a first guiding board unit, a second guiding board unit, and a plurality of conductive probes that pass through the first and the second guiding board units. The conductive probes have a same probe length. Each of the conductive probes includes a stroke segment located between the first guiding board unit and the second guiding board unit, a connection segment, and a testing segment, the latter two of which are respectively connected to two ends of the stroke segment. The stroke segments of the conductive probes have N number of shapes different from each other to allow the conductive probes to have a same contact force and to be configured to meet N number of electrical transmission requirements different from each other, in which N is a positive integer greater than one.

9 Claims, 10 Drawing Sheets

MODULAR VERTICAL PROBE CARD

CROSS-REFERENCE TO RELATED PATENT APPLICATION

This application claims the benefit of priority to Taiwan Patent Application No. 111112388, filed on Mar. 31, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a modular vertical probe card.

BACKGROUND OF THE DISCLOSURE

Conductive probes of a conventional vertical probe card are formed with a same structure so as to possess the same properties. Accordingly, when a device under test (DUT) has different electrical testing requirements, different types of the conventional vertical probe cards will need to be used to meet said requirements, despite the testing time of the DUT being extended as a consequence.

SUMMARY OF THE DISCLOSURE

In response to the above-referenced technical inadequacies, the present disclosure provides a modular vertical probe card to effectively improve on the issues associated with conventional vertical probe cards.

In one aspect, the present disclosure provides a modular vertical probe card having different probes, which includes a first guiding board unit, a second guiding board unit spaced apart from the first guiding board unit, and a plurality of conductive probes that pass through the first guiding board unit and the second guiding board unit. The conductive probes have a same probe length, and each of the conductive probes has an elongated shape defining a longitudinal direction and includes a stroke segment, a connection segment, and a testing segment. The stroke segment is located between the first guiding board unit and the second guiding board unit. The connection segment and the testing segment are respectively connected to two ends of the stroke segment and respectively pass through the first guiding board unit and the second guiding board unit. The stroke segments of the conductive probes have N number of shapes different from each other to be configured to meet N number of electrical transmission requirements different from each other while allowing the conductive probes to have a same contact force, and wherein N is a positive integer greater than one.

Therefore, in the modular vertical probe card provided by the present disclosure, the conductive probes have structural designs that can meet different electrical transmission requirements (e.g., by having the same probe length, and the same contact force through the different stroke segments thereof), thereby effectively decreasing the testing time of the modular vertical probe card.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
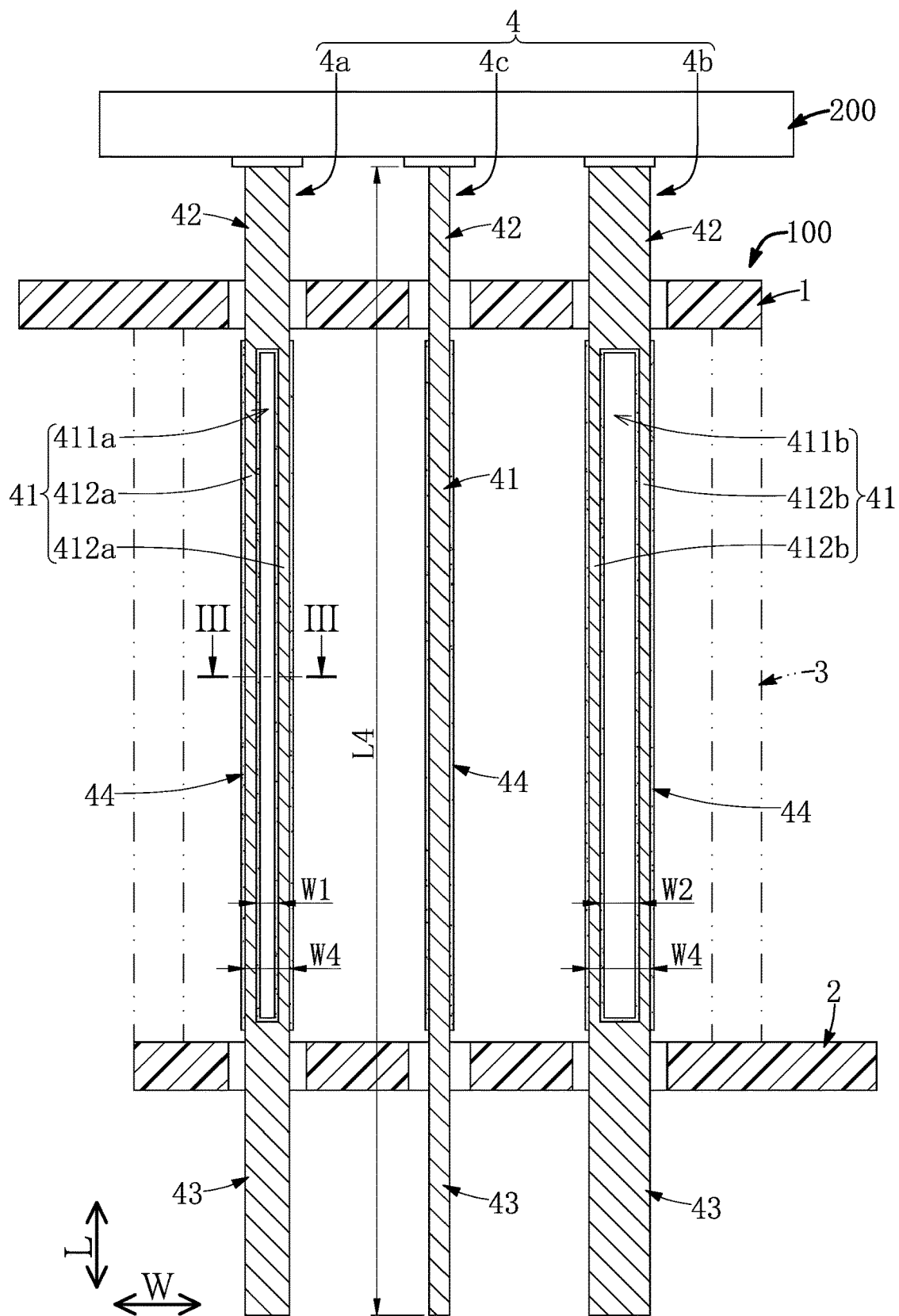
FIG. 1 is a planar view of a modular vertical probe card according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides a modular vertical probe card, which includes a probe head 100 and a space transformer 200 that is abutted against one side of the probe head 100 (e.g., a top side of the probe head 100 shown in FIG. 1). Another side of the probe head 100 (e.g., a bottom side of the probe head 100 shown in FIG. 1) is configured to abut against a device under test (DUT) that is not shown in the drawings and that can be a semiconductor wafer.

It should be noted that in order to clearly describe the present embodiment, the drawings only show a portion of the modular vertical probe card for clearly showing structure and connection relationship of each component of the modular vertical probe card, but the present disclosure is not limited by the drawings. The following description describes the structure and connection relationship of each component of the modular vertical probe card.

Figure 2:
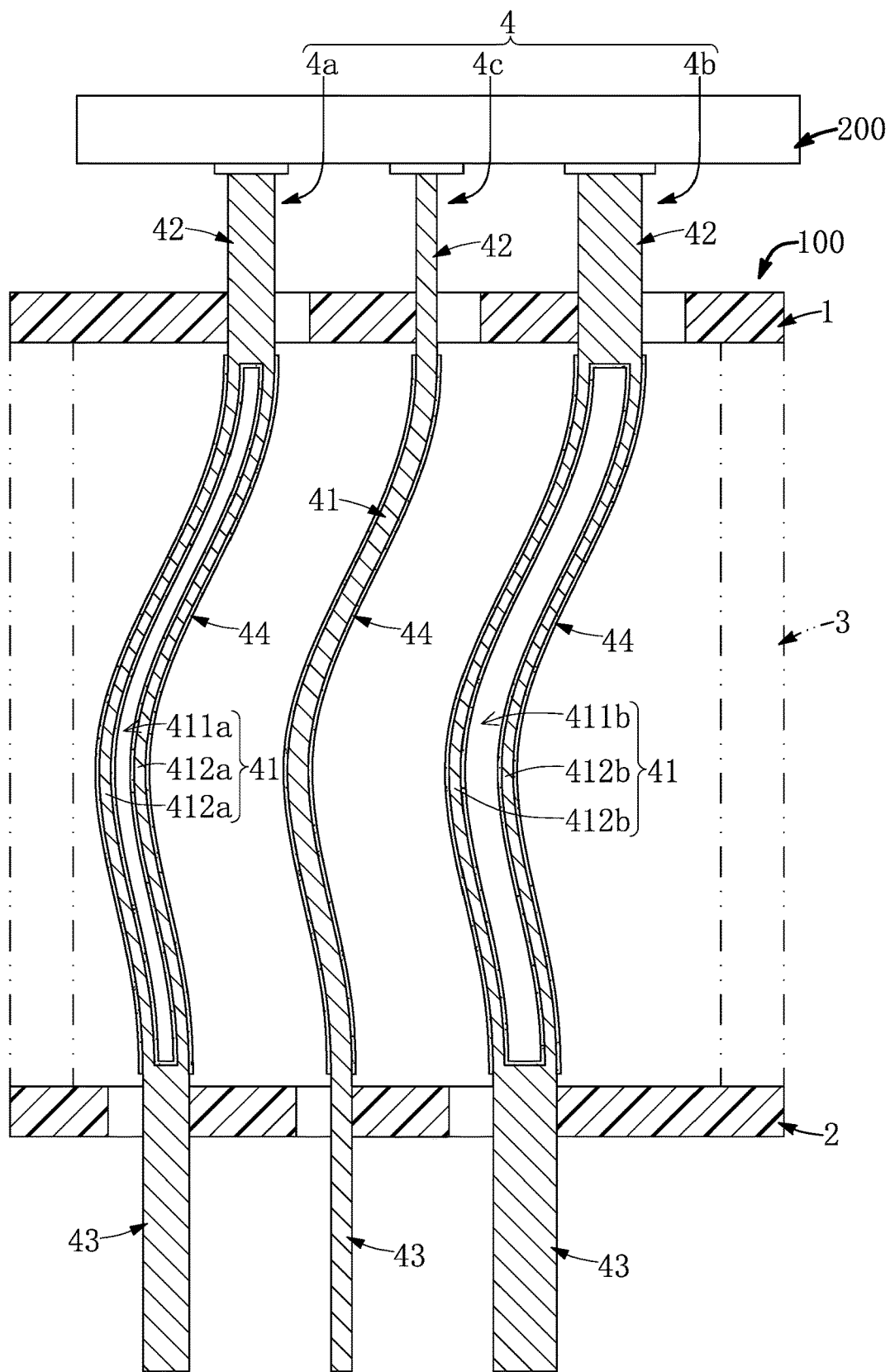
FIG. 2 is a planar view showing the modular vertical probe card of FIG. 1 when a first guiding board unit and a second guiding board unit are staggered with each other.

As shown in FIG. 1 and FIG. 2, the probe head 100 includes a first guiding board unit 1, a second guiding board unit 2 spaced apart from the first guiding board unit 1, a spacer 3 sandwiched between the first guiding board unit 1 and the second guiding board unit 2, and a plurality of conductive probes 4 that pass through the first guiding board unit 1 and the second guiding board unit 2.

It should be noted that the conductive probes 4 in the present embodiment are described in cooperation with the first guiding board unit 1, the second guiding board unit 2, and the spacer 3, but the present disclosure is not limited thereto. For example, in other embodiments of the present disclosure not shown in the drawings, the conductive probe 4 can be independently used (e.g., sold) or can be used in cooperation with other components.

In the present embodiment, the first guiding board unit 1 and the second guiding board unit 2 are spaced apart from each other, the first guiding board unit 1 includes one first guiding board, and the second guiding board unit 2 includes one second guiding board. However, in other embodiments of the present disclosure not shown in the drawings, the first guiding board unit 1 can include a plurality of first guiding boards and at least one spacing sheet that is sandwiched between any two of the first guiding boards adjacent to each other, and the second guiding board unit 2 can include a plurality of second guiding boards and at least one spacing sheet that is sandwiched between any two of the second guiding boards adjacent to each other. Furthermore, the first guiding boards can be staggered with each other, the second guiding boards can be staggered with each other, and the first guiding board unit 1 and the second guiding board unit 2 can be staggered with each other.

The spacer 3 can be a ring-shaped structure sandwiched between peripheral portions of the first guiding board unit 1 and the second guiding board unit 2, but the present disclosure is not limited thereto. For example, in other embodiments of the present disclosure not shown in the drawings, the spacer 3 of the modular vertical probe card can be omitted or can be replaced by other components.

Figure 3:
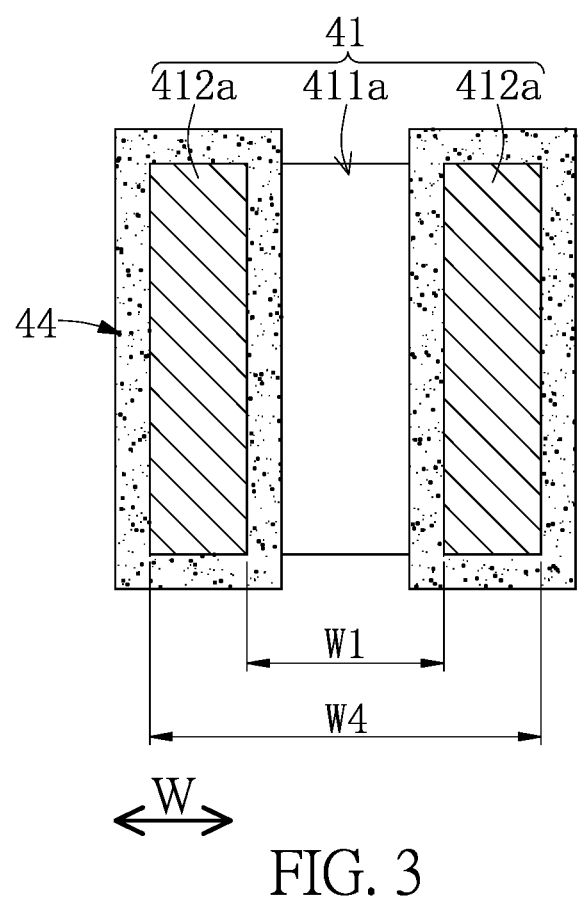
FIG. 3 is a cross-sectional view taken along a line III-III of FIG. 1.

As shown in FIG. 1 and FIG. 3, each of the conductive probes 4 in the present embodiment is integrally formed as a single one-piece structure, and each of the conductive probes 4 has an elongated shape defining a longitudinal direction L. Each of the conductive probes 4 includes a stroke segment 41, a connection segment 42 connected to one end of the stroke segment 41, a testing segment 43 connected to another end of the stroke segment 41, and a ceramic layer 44 that is directly formed on an outer surface of the stroke segment 41.

In the present embodiment, the stroke segment 41 is located between the first guiding board unit 1 and the second guiding board unit 2, the connection segment 42 and the testing segment 43 respectively pass through the first guiding board unit 1 and the second guiding board unit 2, and the ceramic layer 44 in a cross-cut test has a result of at least class 3B under the ASTM standard, but the present disclosure is not limited thereto. For example, in other embodiment of the present disclosure not shown in the drawings, the ceramic layer 44 of each of the conductive probes 4 can be omitted or can be replaced by other materials (e.g., silicon carbide, aluminum nitride, aluminum oxide, silicon nitride, or other insulating materials with high heat-dissipation and high voltage resistance) according to design requirements.

Specifically, the stroke segments 41 of the conductive probes 4 have N number of shapes different from each other (e.g., the connection segments 42 and/or the testing segments 43 of the conductive probes 4 in the present embodiment can be identical or different from each other, but the present disclosure is not limited thereto) to be configured to meet N number of electrical transmission requirements different from each other while allowing the conductive probes 4 to have a same contact force, in which N is a positive integer greater than one.

The conductive probes 4 in the present embodiment can be of different structures through the stroke segments 41, but when the first guiding board unit 1 and the second guiding board unit 2 are staggered with each other, the stroke segments 41 of the conductive probes 4 preferably bend elastically in a same direction (as shown in FIG. 2).

Moreover, the conductive probes 4 can be provided with the same contact force through structural design thereof. For example, the conductive probes 4 have a same probe length L4 that can be within a range from 5 mm to 8 mm; or, the conductive probes 4 can be further limited to having the following conditions: the stroke segments 41 of any two of the conductive probes 4 having the shapes different from each other have different external surface areas and have a same smallest cross-sectional area perpendicular to the longitudinal direction L.

In addition, the N number of the electrical transmission requirements include at least two different signal transmission requirements, and the stroke segments 41 of at least two of the conductive probes are formed in different shapes according to the at least two different signal transmission requirements for impedance matching.

Or, the N number of the electrical transmission requirements include at least two different current transmission requirements, and the stroke segments 41 of at least two of the conductive probes 4 are formed in different shapes according to the at least two different current transmission requirements, such as to have load current values respectively corresponding to the at least two different current transmission requirements.

It should be noted that when a conductive probe having any structure or configuration satisfies the above specific conditions, the above conductive probe can be applied to the modular vertical probe card of the present embodiment. In other words, a structure of the conductive probe 4 of the present embodiment is not limited and can be adjusted or changed according to design requirements. In order to clearly describe the present embodiment, the following description merely discloses some possible structures of the conductive probe 4, but the present disclosure is not limited thereto.

The conductive probes 4 includes a rectangular probe 4c, a first probe 4a, and a second probe 4b, which can be distinguished from each other by structures. Specifically, N in the present embodiment is three, but the present disclosure is not limited thereto. The rectangular probe 4c can be provided without any thru-hole formed in the stroke segment 41 thereof, and the rectangular probe 4c of the present embodiment is a straight structure parallel to the longitudinal direction L, but the present disclosure is not limited thereto.

Moreover, the first probe 4a has a first penetrating slot 411a formed in the stroke segment 41 thereof along the longitudinal direction L. The stroke segment 41 of the first probe 4a has two first arms 412a respectively arranged at two opposite sides of the first penetrating slot 411a. The second probe 4b has a second penetrating slot 411b formed in the stroke segment 41 thereof along the longitudinal direction L. The stroke segment 41 of the second probe 4b has two second arms 412b respectively arranged at two opposite sides of the second penetrating slot 411b. Moreover, along a direction perpendicular to the longitudinal direction L, a cross-sectional area of the stroke segment 41 of the rectangular probe 4c is equal to a sum of smallest cross-sectional areas of the two first arms 412a of the first probe 4a, and is equal to a sum of smallest cross-sectional areas of the two second arms 412b of the second probe 4b. That is to say, in the first probe 4a, the second probe 4b, and the rectangular probe 4c, smallest cross sections of the stroke segments 41 have a same area.

However, external surface areas of the stroke segments 41 of the first probe 4a, the second probe 4b, and the rectangular probe 4c are different from each other. Specifically, the two first arms 412a of the first probe 4a are spaced apart from each other by a first adjustment distance W1, and the two second arms 412b of the second probe 4b are spaced apart from each other by a second adjustment distance W2 that is different from the first adjustment distance W1.

In the present embodiment, any one of the first adjustment distance W1 and the second adjustment distance W2 is within a range from 10 µm to 120 µm. Moreover, along a width direction W perpendicular to the longitudinal direction L, two lateral surfaces of the stroke segment 41 of any one of the first probe 4a and the second probe 4b arranged away from each other are spaced apart from each other by a probe width W4 that is within a range from 50 µm to 160 µm.

In any one of the first probe 4a and the second probe 4b, the ceramic layer 44 is directly formed on an outer surface of the stroke segment 41 and covers all inner walls the first penetrating slot 411a or the second penetrating slot 411b. The ceramic layer 42 of any one of the first probe 4a and the second probe 4b is not arranged in the first guiding board unit 1 and the second guiding board unit 2 (or, the ceramic layer 42 is not formed on the connection segment 43 and the testing segment 44), thereby preventing the ceramic layer 42 from rubbing against the first guiding board unit 1 or the second guiding board unit 2 to generate particles.

Specifically, in any one of the first probe 4a and the second probe 4b, the ceramic layer 44 extends from a middle of the stroke segment 41 toward the connection segment 42 and the testing segment 43, and the first penetrating slot 411a or the second penetrating slot 411b can be not fully filled with the ceramic layer 44 as shown in FIG. 1.

Figure 4:
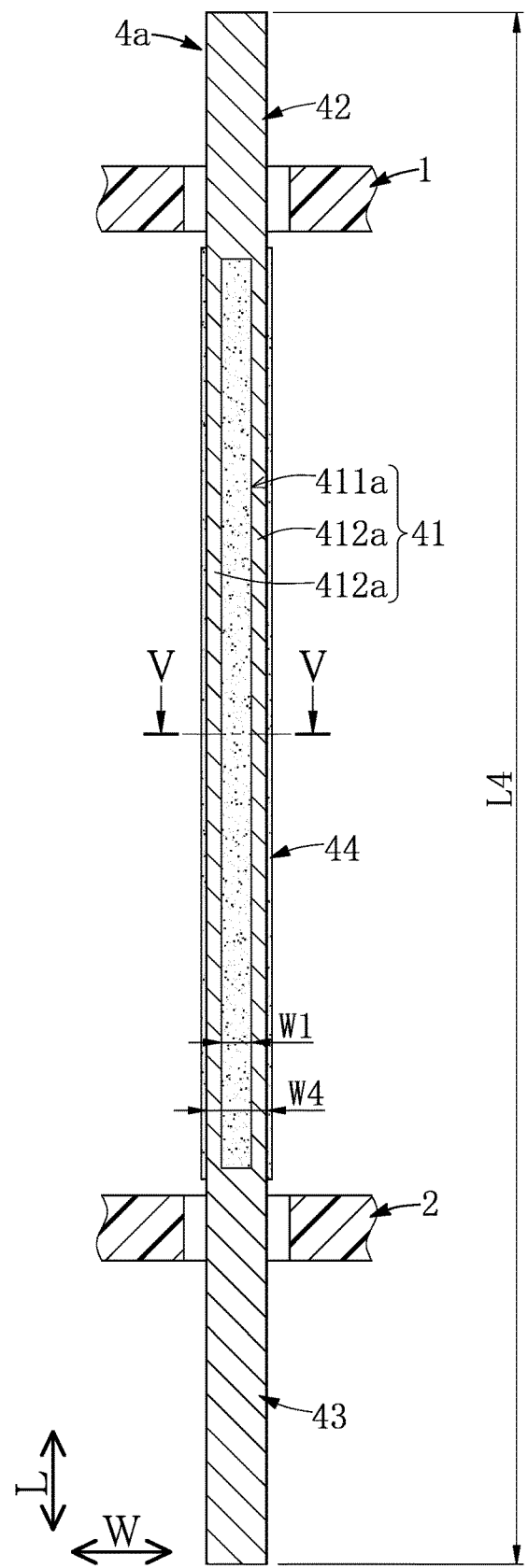
FIG. 4 is a planar view showing a first probe of FIG. 1 in another configuration.
Figure 5:
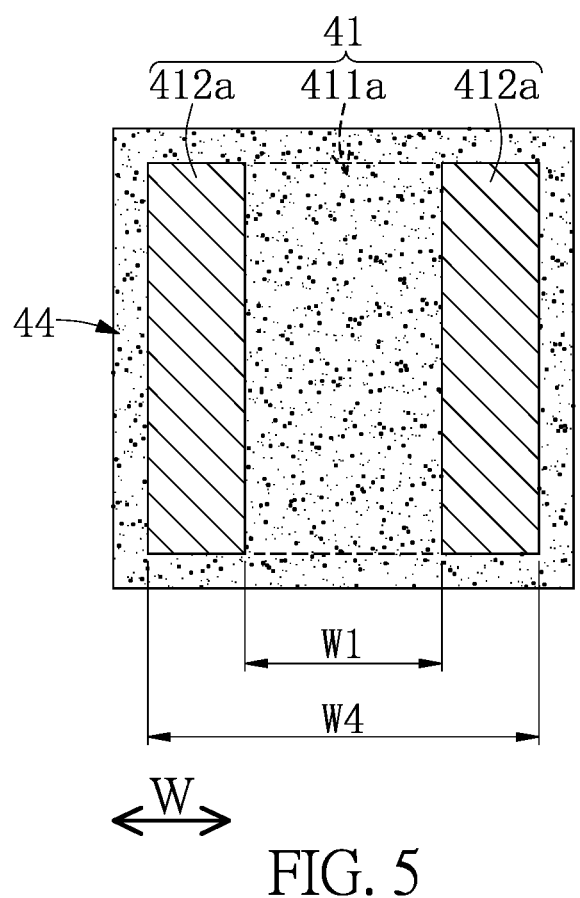
FIG. 5 is a cross-sectional view taken along a line V-V of FIG. 4.

In addition, the first penetrating slot 411a can be fully filled with the ceramic layer 44 as shown in FIG. 4 and FIG. 5, so that the first penetrating slot 411a is embedded in the ceramic layer 44, but the present disclosure is not limited thereto. For example, in other embodiments of the present disclosure not shown in the drawings, the second penetrating slot 411b can be fully filled with the ceramic layer 44, so that the second penetrating slot 411b is embedded in the ceramic layer 44.

Second Embodiment

Referring to FIG. 6 to FIG. 10, a second embodiment of the present disclosure is provided, which is similar to the first embodiment of the present disclosure. For the sake of brevity, descriptions of the same components in the first and second embodiments of the present disclosure will be omitted herein, and the following description only discloses different features between the first and second embodiments.

Figure 6:
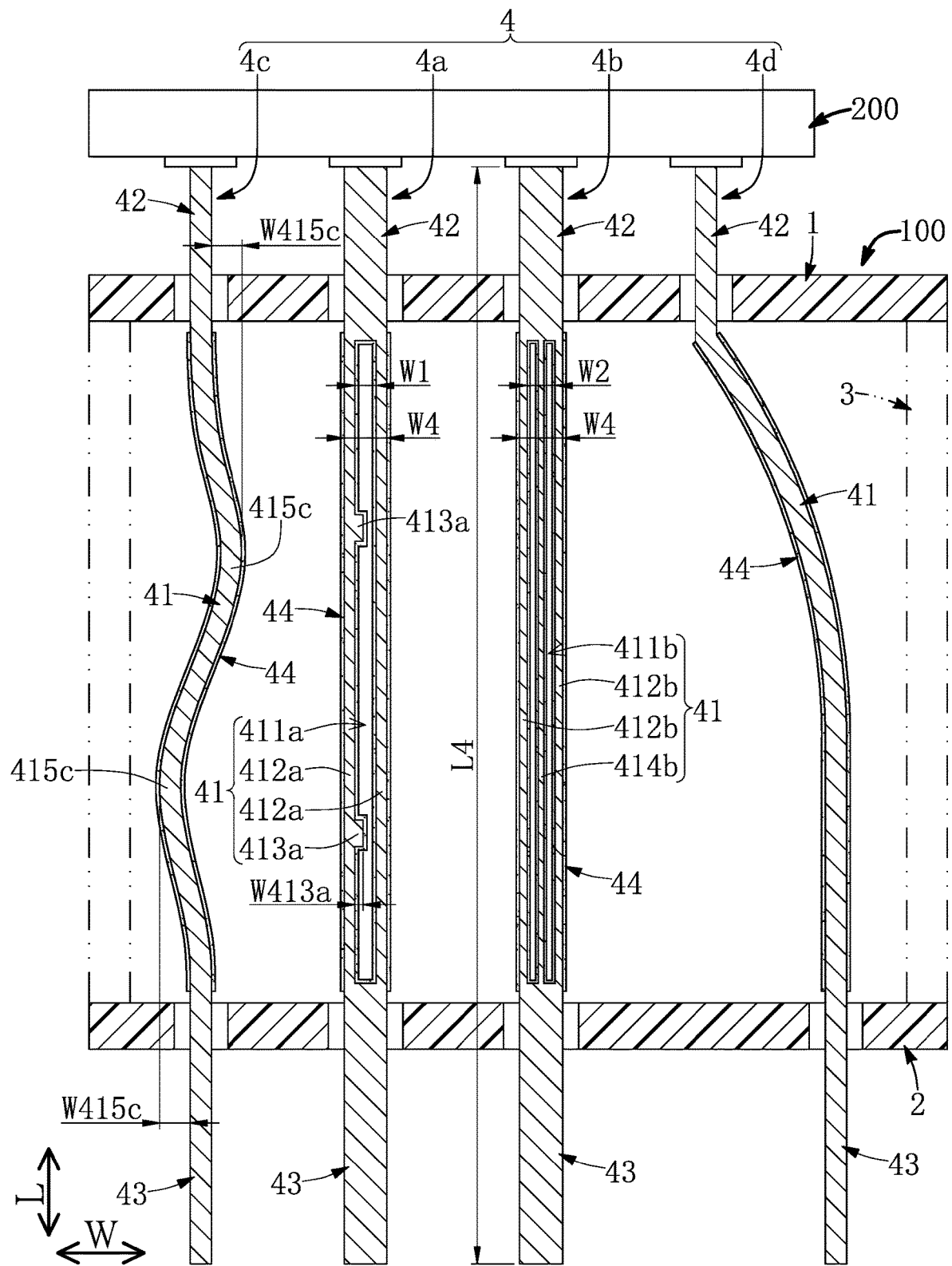
FIG. 6 is a planar view of the modular vertical probe card according to a second embodiment of the present disclosure.

As shown in FIG. 6, the stroke segment 41 of the rectangular probe 4c includes two curved portions 415c facing toward two opposite directions. Moreover, along the width direction W, the connection segment 42 of the rectangular probe 4c is spaced apart from an apex of one of the two curved portions 415c adjacent thereto by a transverse distance W415c that is within a range from 10 µm to 150 µm.

Furthermore, the first probe 4a has at least one protrusion 413a arranged in the first penetrating slot 411a. The at least one protrusion 413a extends from one of two long walls of the first penetrating slot 411a along the width direction W by a predetermined width W413a, and is spaced apart from another one of the two long walls of the first penetrating slot 411a.

Figure 7:
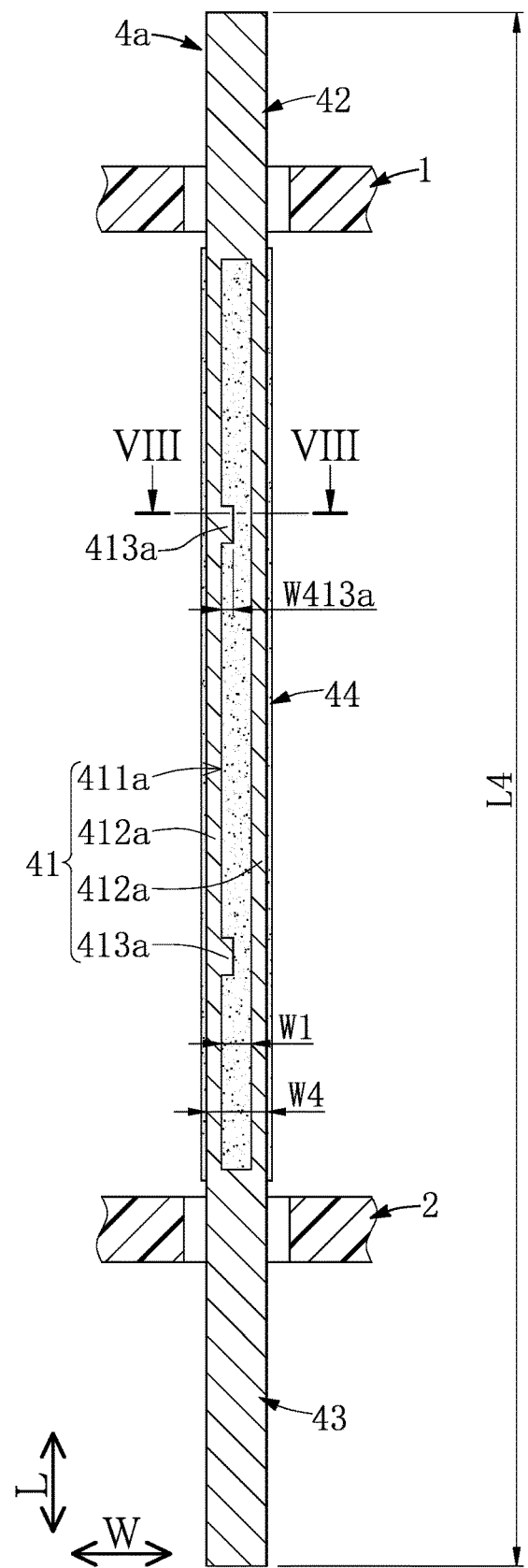
FIG. 7 is a planar view showing the first probe of FIG. 6 in another configuration.
Figure 8:
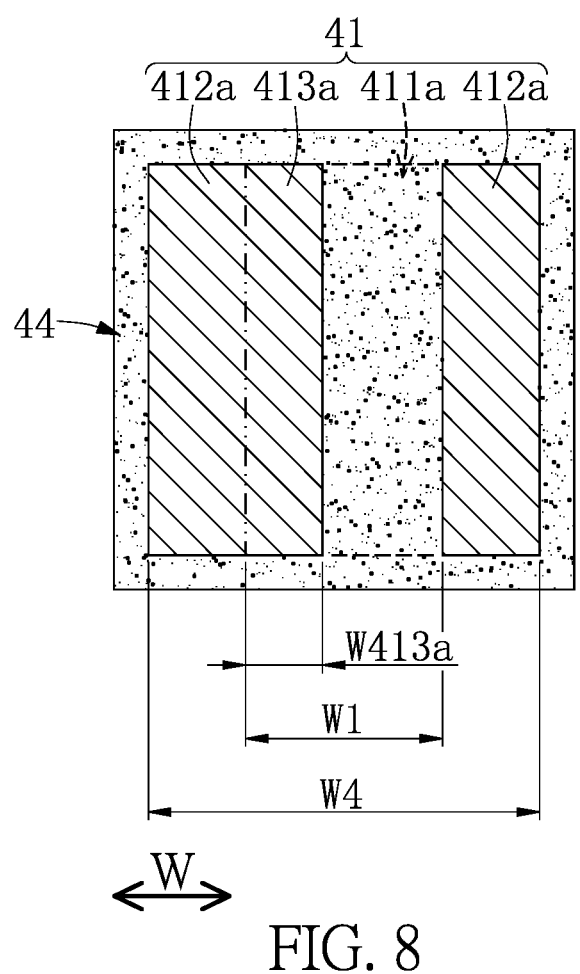
FIG. 8 is a cross-sectional view taken along a line VIII-VIII of FIG. 7.
Figure 9:
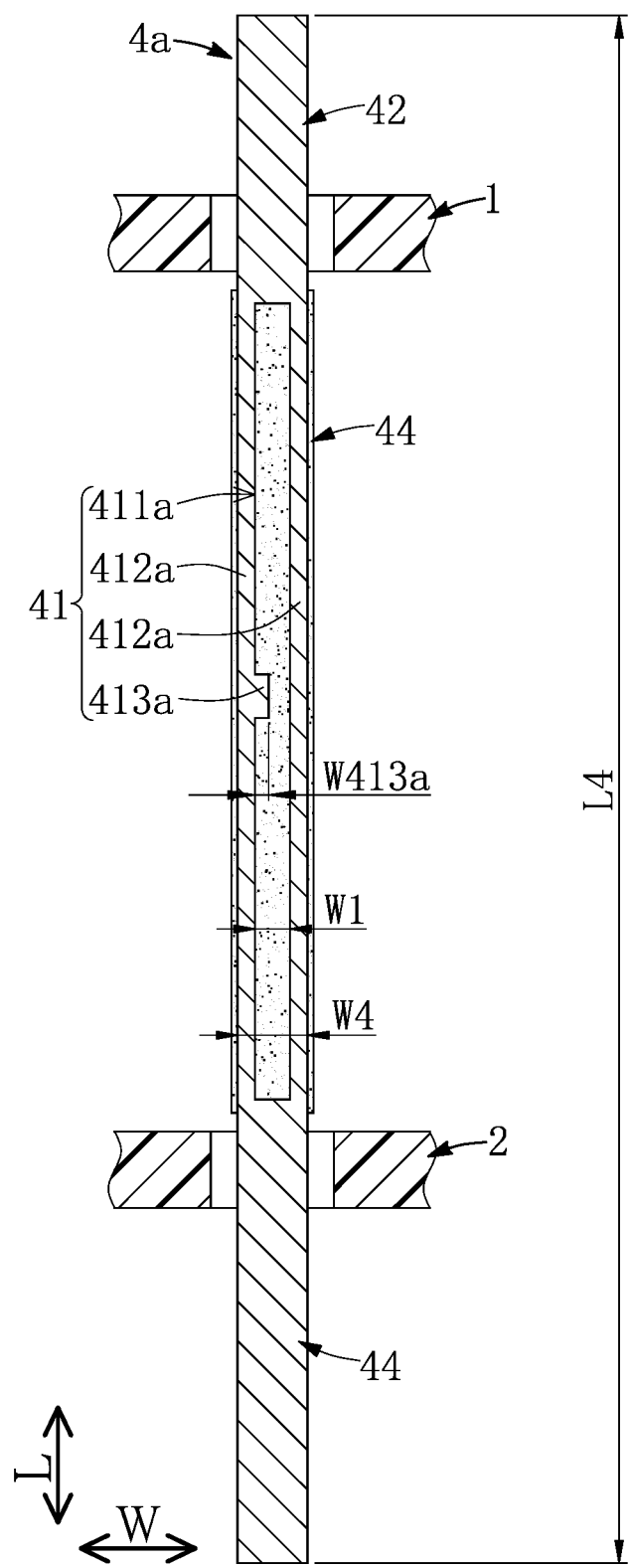
FIG. 9 is a planar view showing the first probe of FIG. 6 in yet another configuration.

The predetermined width W413a is preferably within a range from 5 µm to 10 µm, and the shape of the at least one protrusion 413a can be adjusted or changed according to design requirements (e.g., a square shape, a trapezoid shape, or a semicircle shape) and is not limited by the drawings of the present embodiment. In addition, the first penetrating slot 411a can be fully filled with the ceramic layer 44 as shown in FIG. 7 and FIG. 8, so that the at least one protrusion 413a is embedded in the ceramic layer 44; or, as shown in FIG. 9, a quantity of the at least one protrusion 413a of the first probe 4a can be just one.

In the second probe 4b, the stroke segment 41 includes at least one inner arm 414b located between the two second arms 412b. The structural features of the two second arms 412b in the present embodiment are identical to that of the first embodiment, and a quantity of the at least one inner aim 414b in the present embodiment is just one, but the present disclosure is not limited thereto.

Figure 10:
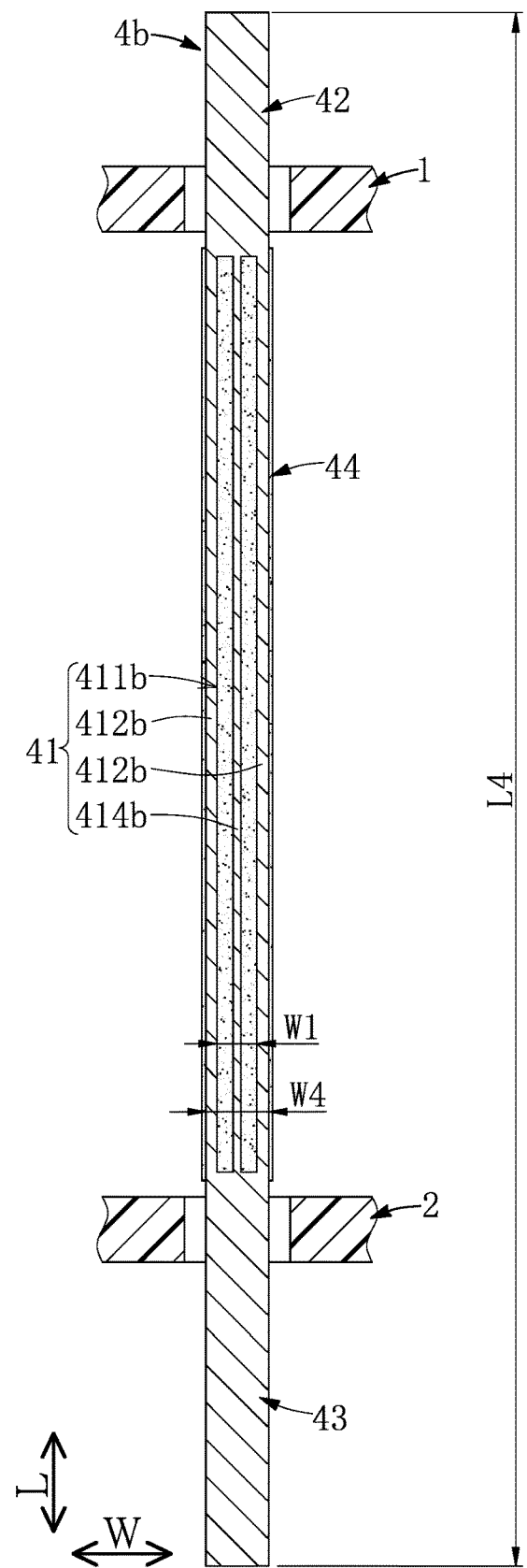
FIG. 10 is a planar view showing a second probe of FIG. 6 in another configuration.

Specifically, the at least one inner arm 414b in the present embodiment is parallel to the longitudinal direction L or any one of the two second arms 412b, and is arranged in the second penetrating slot 411b. The ceramic layer 44 of the present embodiment can cover all inner walls of the second penetrating slot 411b as shown in FIG. 6, but the present disclosure is not limited thereto. For example, as shown in FIG. 10, the second penetrating slot 411b can be fully filled with the ceramic layer 44, so that the at least one inner arm 414b is embedded in the ceramic layer 44.

In addition, the conductive probes 4 of the present embodiment can further include a conventional probe. For example, a cobra probe 4d shown in FIG. 6 can have a contact force identical to that of other conductive probes 4 by adjusting the probe length L4 and the stroke segment 41 thereof, thereby meeting one of the N number of the electrical transmission requirements.

Beneficial Effects of the Embodiments

In conclusion, the conductive probes have structural designs that can meet different electrical transmission requirements (e.g., by having the same probe length, and the same contact force through the different stroke segments thereof), thereby effectively decreasing the testing time of the modular vertical probe card.

Moreover, the structural design of the conductive probe provided by the present disclosure can allow the ceramic layer to be formed on a specific position of the stroke segment (e.g., the ceramic layer is not arranged in the first guiding board unit and the second guiding board unit) for replacing the conventional insulating layer made of polymer material, thereby effectively increasing the heat-dissipation performance of the conductive probe.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A modular vertical probe card having different probes, comprising:
   a first guiding board unit and a second guiding board unit that is spaced apart from the first guiding board unit; and
   a plurality of conductive probes passing through the first guiding board unit and the second guiding board unit, wherein the conductive probes have a same probe length, and each of the conductive probes has an elongated shape defining a longitudinal direction and includes:
      a stroke segment located between the first guiding board unit and the second guiding board unit; and
      a connection segment and a testing segment that are respectively connected to two ends of the stroke segment and that respectively pass through the first guiding board unit and the second guiding board unit;
   wherein the stroke segments of the conductive probes have N number of shapes different from each other to be configured to meet N number of electrical transmission requirements different from each other while allowing the conductive probes to have a same contact force, and wherein N is a positive integer greater than one;
   wherein the conductive probes include:
   a rectangular probe not having any thru-hole formed in the stroke segment thereof; and
   a first probe having a first penetrating slot formed in the stroke segment thereof along the longitudinal direction, wherein the stroke segment of the first probe has two first arms respectively arranged at two opposite sides of the first penetrating slot;
   wherein along a direction perpendicular to the longitudinal direction, a cross-sectional area of the stroke segment of the rectangular probe is equal to a sum of smallest cross-sectional areas of the two first arms of the first probe.

2. The modular vertical probe card according to claim 1, wherein the N number of the electrical transmission requirements include at least two different signal transmission requirements, and the stroke segments of at least two of the conductive probes are formed in different shapes according to the at least two different signal transmission requirements for impedance matching.

3. The modular vertical probe card according to claim 2, wherein the N number of the electrical transmission requirements include at least two different current transmission requirements, and the stroke segments of at least two of the conductive probes are formed in different shapes according to the at least two different current transmission requirements, such as to have load current values respectively corresponding to the at least two different current transmission requirements.

4. The modular vertical probe card according to claim 3, wherein the stroke segments of any two of the conductive probes having the shapes different from each other have different external surface areas and have a same smallest cross-sectional area perpendicular to the longitudinal direction.

5. The modular vertical probe card according to claim 4, wherein each of the conductive probes includes a ceramic layer directly formed on an outer surface of the stroke segment thereof, and wherein cross-cut test results of the ceramic layer of each of the conductive probes is at least class 3B under the ASTM standard.

6. The modular vertical probe card according to claim 1, wherein the conductive probes include:
   a second probe having a second penetrating slot formed in the stroke segment thereof along the longitudinal direction, wherein the stroke segment of the second probe has two second arms respectively arranged at two opposite sides of the second penetrating slot;
   wherein the two first arms of the first probe are spaced apart from each other by a first adjustment distance, and the two second arms of the second probe are spaced apart from each other by a second adjustment distance that is different from the first adjustment distance.

7. The modular vertical probe card according to claim 6, wherein along the direction perpendicular to the longitudinal direction, a sum of smallest cross-sectional areas of the two second arms of the second probe is equal to the sum of the smallest cross-sectional areas of the two first arms of the first probe.

8. The modular vertical probe card according to claim 6, wherein external surface areas of the stroke segments of the first probe, the second probe, and the rectangular probe are different from each other.

9. The modular vertical probe card according to claim 1, wherein, in the rectangular probe, the stroke segment includes two curved portions facing toward two opposite directions, and wherein along the width direction, the connection segment is spaced apart from an apex of one of the two curved portions adjacent thereto by a transverse distance that is within a range from 10 μm to 150 μm.

* * * * *